(12) United States Patent
Rimondi et al.

(10) Patent No.: US 9,263,120 B2
(45) Date of Patent: Feb. 16, 2016

(54) DYNAMICALLY CONFIGURABLE SRAM CELL FOR LOW VOLTAGE OPERATION

(75) Inventors: Danilo Rimondi, Mozzo (IT); Carolina Selva, Cologno Monzese (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 462 days.

(21) Appl. No.: 13/173,333

(22) Filed: Jun. 30, 2011

(65) Prior Publication Data

US 2012/0002460 A1    Jan. 5, 2012

(30) Foreign Application Priority Data

Jun. 30, 2010 (IT) .............................. MI2010A1194

(51) Int. Cl.
| | |
|---|---|
| *G11C 7/00* | (2006.01) |
| *G11C 11/419* | (2006.01) |
| *G11C 11/412* | (2006.01) |

(Continued)

(52) U.S. Cl.
CPC ............ *G11C 11/419* (2013.01); *G11C 11/412* (2013.01); *H01L 21/74* (2013.01); *H01L 27/11* (2013.01)

(58) Field of Classification Search
CPC .............................. G11C 11/412; G11C 5/147
USPC .......................................... 365/156, 154, 226
See application file for complete search history.

(56) References Cited

U.S. PATENT DOCUMENTS

| | | | |
|---|---|---|---|
| 5,943,258 A | 8/1999 | Houston et al. | |
| 6,998,722 B2 | 2/2006 | Madurawe | |
| 7,092,279 B1 | 8/2006 | Sheppard | |

(Continued)

FOREIGN PATENT DOCUMENTS

JP             2009093702            4/2009

OTHER PUBLICATIONS

Search Report for Italian Patent Application No. MI20101194, Ministero dello Sviluppo Economico, Munich, Jan. 10, 2011, pp. 3.

(Continued)

*Primary Examiner* — Son Dinh
*Assistant Examiner* — Uyen B Tran
(74) *Attorney, Agent, or Firm* — Gardere Wynne Sewell LLP

(57) ABSTRACT

An embodiment of a memory device of SRAM type is proposed. The memory device includes a plurality of memory cells each for storing a first logic value represented by a first reference voltage or a second logic value represented by a second reference voltage. Each memory cell includes a bistable latch—having a main terminal, a complementary terminal, a set of main storage transistors for maintaining the main terminal at the reference voltage corresponding to the stored logic value, and a set of complementary storage transistors to maintain the complementary terminal at the reference voltage corresponding to the complement of the stored logic value—a main access transistor and a complementary access transistor for accessing the main terminal and the complementary terminal, respectively. The memory device may further include biasing means for modifying a value of a threshold voltage of at least one of the main transistors to a first threshold voltage value or to a second threshold voltage value and for modifying a threshold voltage value of at least one of the complementary transistors to the second threshold voltage value or to the first threshold voltage value during a write operation of the first logic value or of the second logic value, respectively, in the memory cell.

17 Claims, 6 Drawing Sheets

(51) Int. Cl.
*H01L 21/74* (2006.01)
*H01L 27/11* (2006.01)

(56) References Cited

U.S. PATENT DOCUMENTS

| | | |
|---|---|---|
| 7,176,125 B2 | 2/2007 | Liaw |
| 7,711,998 B2 * | 5/2010 | Foeste ........................ 714/721 |
| 8,537,602 B2 | 9/2013 | Rimondi et al. |
| 2004/0214389 A1 | 10/2004 | Madurawe |
| 2005/0078546 A1 | 4/2005 | Hirano et al. |
| 2005/0207212 A1 | 9/2005 | Tsujimura et al. |
| 2007/0047364 A1 * | 3/2007 | Chuang et al. ............... 365/226 |
| 2007/0076467 A1 * | 4/2007 | Yamaoka et al. ............. 365/154 |
| 2007/0139997 A1 | 6/2007 | Suzuki et al. |
| 2008/0304314 A1 | 12/2008 | Huffman et al. |
| 2009/0244956 A1 * | 10/2009 | Inoue ............................ 365/156 |

OTHER PUBLICATIONS

Search Report for Italian Patent Application No. MI20101196, Ministero dello Sviluppo Economico, Munich, Nov. 26, 2010, pp. 3.

S. C. Liu and J. B. Kuo, "A Novel 0.7V Two-Port 6T SRAM Memory Cell Structure with Single-Bit-Line Simultaneous Read-and-Write Access (SBLSRWA) Capability using Partially-Depleted SOI CMOS Dynamic-Threshold Technique", 1999 IEEE International SOI Conference, Oct. 1999, pp. 75-76.

* cited by examiner

DYNAMICALLY CONFIGURABLE SRAM CELL FOR LOW VOLTAGE OPERATION

PRIORITY CLAIM

The instant application claims priority to Italian Patent Application No. MI2010A001194, filed Jun. 30, 2010, which application is incorporated herein by reference in its entirety.

RELATED APPLICATION DATA

This application is related to U.S. patent application Ser. No. 13/173,272, entitled 5T SRAM MEMORY FOR LOW VOLTAGE APPLICATIONS filed Jun. 302011, which application is incorporated herein by reference in its entirety.

TECHNICAL FIELD

An embodiment relate to the field of memories. More specifically, an embodiment relates to a Static Random Access Memory or SRAM.

BACKGROUND

For some time the market of electronic products has increasingly focused on mobile devices (computers, mobile phones, and personal digital assistants, for example). Batteries that have a limited availability of energy provide power needed to operate these mobile devices. Thus the need of reducing the power consumption of all the electronic components (central processing unit, memory, display, etc.) included in mobile devices arose, in order to extend the autonomy of such mobile devices with the same batteries used.

Typically, the electronic components are Systems On A Chip or SOCs, i.e., complete electronic systems integrated on a single chip of semiconductor material. In this case, the desired reduction in power consumption is achieved through a reduction in operating voltages of transistors included in the SOCs. In particular, the SRAMs included in such SOCs comprise a number of transistors which is equal to 50%-90% of the total number of transistors present on the same SOC. Considering that the power consumption of electronic components affects the total power consumption of the SOC in proportion to their number of transistors, it is clear that the reduction of the operating voltage of the SRAM memories results in a substantial reduction in the power consumption of the entire SOC.

As it is known, a random access memory or RAM is a special type of memory wherein each memory cell (capable of storing a binary data, or bit) may be directly accessed with the same access time. In particular, a SRAM memory does not require any refresh operation of the stored data, as it retains data values for a theoretically infinite time (at least up to a shutdown of an electronic system wherein the SRAM memory is used).

The reference memory cell in the SRAM memories (for example, commonly used in CMOS-type technology) is formed by six transistors, and therefore it is usually called "6T" memory cell. In particular, a 6T memory cell includes a bistable latch formed by two crossed logic inverters (i.e., with an input of each inverter connected to an output of the other inverter), each of which includes two transistors. The bistable latch has two stable equilibrium conditions corresponding to the two possible logic values (i.e., 0 or 1) of the stored bit. Two access transistors are used to selectively access the bistable latch during a read or write operation of the corresponding memory cell.

Unfortunately, the reduction of the operating voltages of the transistors may generate serious problems related to the reliability of the memory cell. Indeed, at a low operating voltage it is much more difficult, if not impossible, to force the switching of the transistors for writing the memory cell (as the operating voltage may be not sufficient to overcome a threshold voltage of the transistors required for their switching). However, the circuit specifications required for a reliable writing (i.e., able to properly write the wanted bit in the memory cell) are opposed to the circuit specifications needed to achieve a stable reading (i.e., a reading that does not change the bit stored in the read memory cell) and to obtain a stable standby condition (i.e., where no changes occur in the bit stored upon time). In more detail, for achieving a correct writing, the access transistors should be very conductive to force the bistable latch to change its equilibrium condition, while for ensuring a stable reading and a stable standby condition, the access transistors should have a reduced conductivity to avoid an undesired switching of the bistable latch (though this conductivity may not be kept too low so as to allow transferring the read bit). Therefore, known expedients concerning ratios between the transistor sizes or form factors of the transistors themselves may not be successfully applied; for example, optimizing the form factors of the transistors to obtain a reliable writing may result in a memory cell with low stability in reading and in standby condition and, conversely, optimizing the form factors to have a stable memory cell in reading and in the stand-by condition may result in a low reliability in writing.

The problem of the stability in reading and in the standby condition is exacerbated by the increasingly size reduction (scaling) of the transistors. In this case, the transistors are much more sensitive to changes in voltage at their terminals, and this may lead to unwanted currents even for small voltage fluctuations (e.g., tenths of a volt). In addition, transistors with very reduced dimensions are subject to greater fluctuations in the values of their physical parameters (due to the increased weight of aberrations in an optical lithographic technique commonly used for their formation). Therefore, transistors formed at different times and/or in different regions of the same chip may present mismatches in their physical parameters, undermining the correct and stable operation of devices wherein a good degree of symmetry is important (as in case of memory cells).

SUMMARY

In general terms, an embodiment is based on the idea of selectively biasing the transistors of a memory cell.

More specifically, an embodiment is a memory device of a SRAM type. The memory device includes a plurality of memory cells each for storing a first logic value (represented by a first reference voltage) or a second logic value (represented by a second reference voltage). Each memory cell includes a bistable latch having a main terminal, a complementary terminal, a set of main storage transistors (for maintaining the main terminal at the reference voltage corresponding to the stored logic value), and a set of complementary storage transistors (for maintaining the complementary terminal at the reference voltage corresponding to the complement of the stored logic value); the memory cell further includes a main access transistor and a complementary access transistor for accessing the main terminal and the complementary terminal, respectively. In an embodiment, the memory device further includes biasing means for modifying a threshold voltage value of at least one of the main transistors to a first threshold voltage value or to a second threshold voltage value and for modifying a threshold voltage value of at least one of the complementary transistors to the second threshold voltage value or to the first threshold voltage value during a write operation of the first logic value or of the second logic value, respectively, in the memory cell.

Another embodiment is a corresponding method.

BRIEF DESCRIPTION OF THE DRAWINGS

One or more embodiments, as well as features and advantages thereof, will be better understood with reference to the following detailed description, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION

Figure 1:
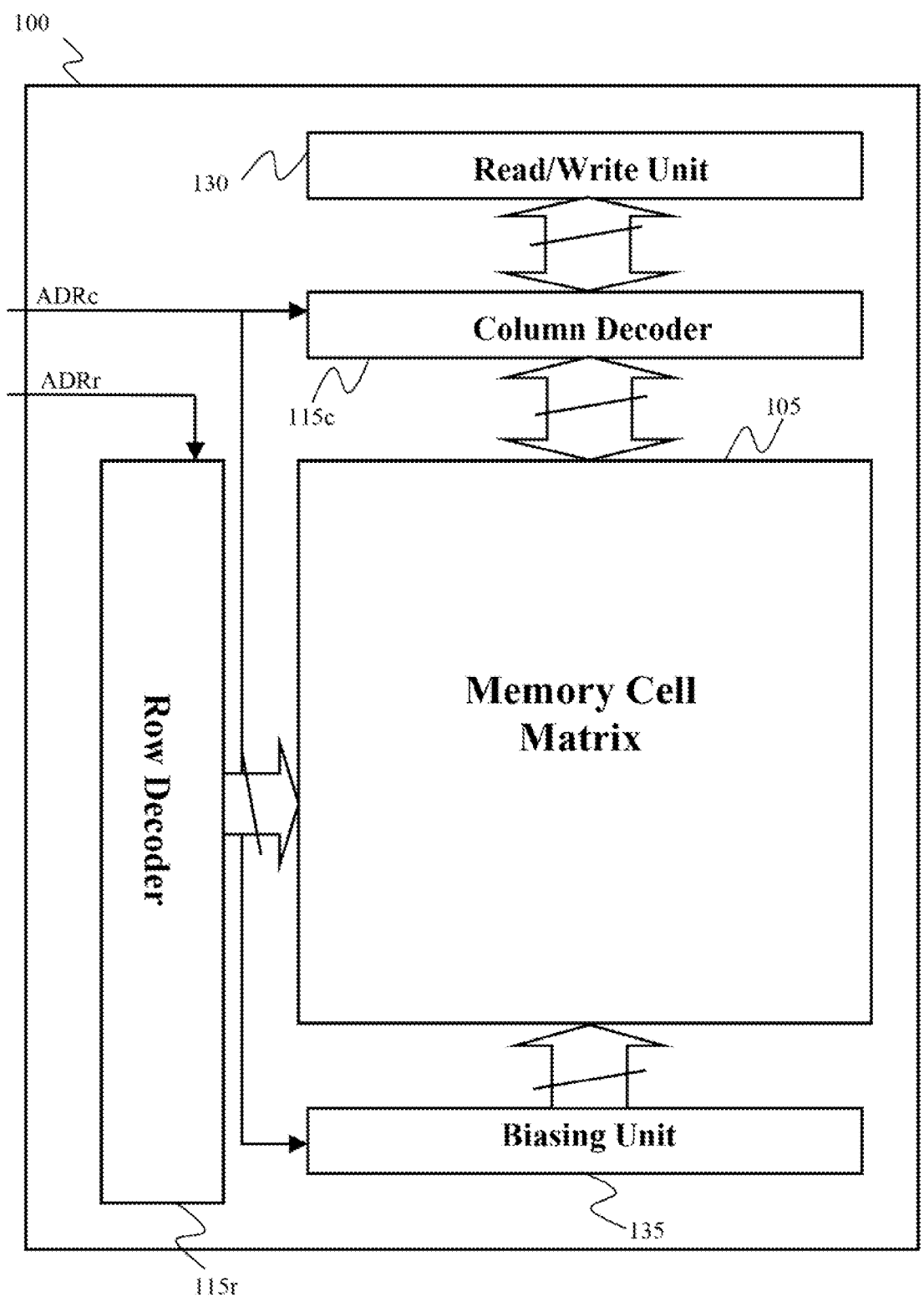
FIG. 1 shows a principle block diagram of a memory device in which an embodiment is applicable.

With particular reference to FIG. 1, there is shown a principle block diagram of a memory device 100, wherein an embodiment is applicable; more specifically, the memory device 100 is of SRAM type. The memory device 100 includes a matrix 105 of memory cells (not shown), which is organized into rows and columns. Each memory cell is adapted to store a bit; normally, the memory device 100 simultaneously processes (in writing and reading) words of a certain number of bits (e.g., 8), by accessing a same number of memory cells simultaneously.

The memory device 100 also includes a row decoder 115r and a column decoder 115c. Access to memory cells of a selected word (in reading and writing) is made by decoding a row address ADRr and a column address ADRc, which are supplied to the row decoder 115r and to the column decoder 115c, respectively. In response thereto, the row decoder 115r selectively provides different bias voltages to the memory cells of each row; in addition, the column decoder 115c selectively couples the memory cells of each selected column to a read/write unit 130, which contains all the circuitry used to read and write the selected memory cells (e.g., driving circuits, comparators, etc.). Additionally, the column address ADRc is supplied to a biasing unit 135, which selectively provides various further bias voltages to the memory cells of each column.

Figure 2:
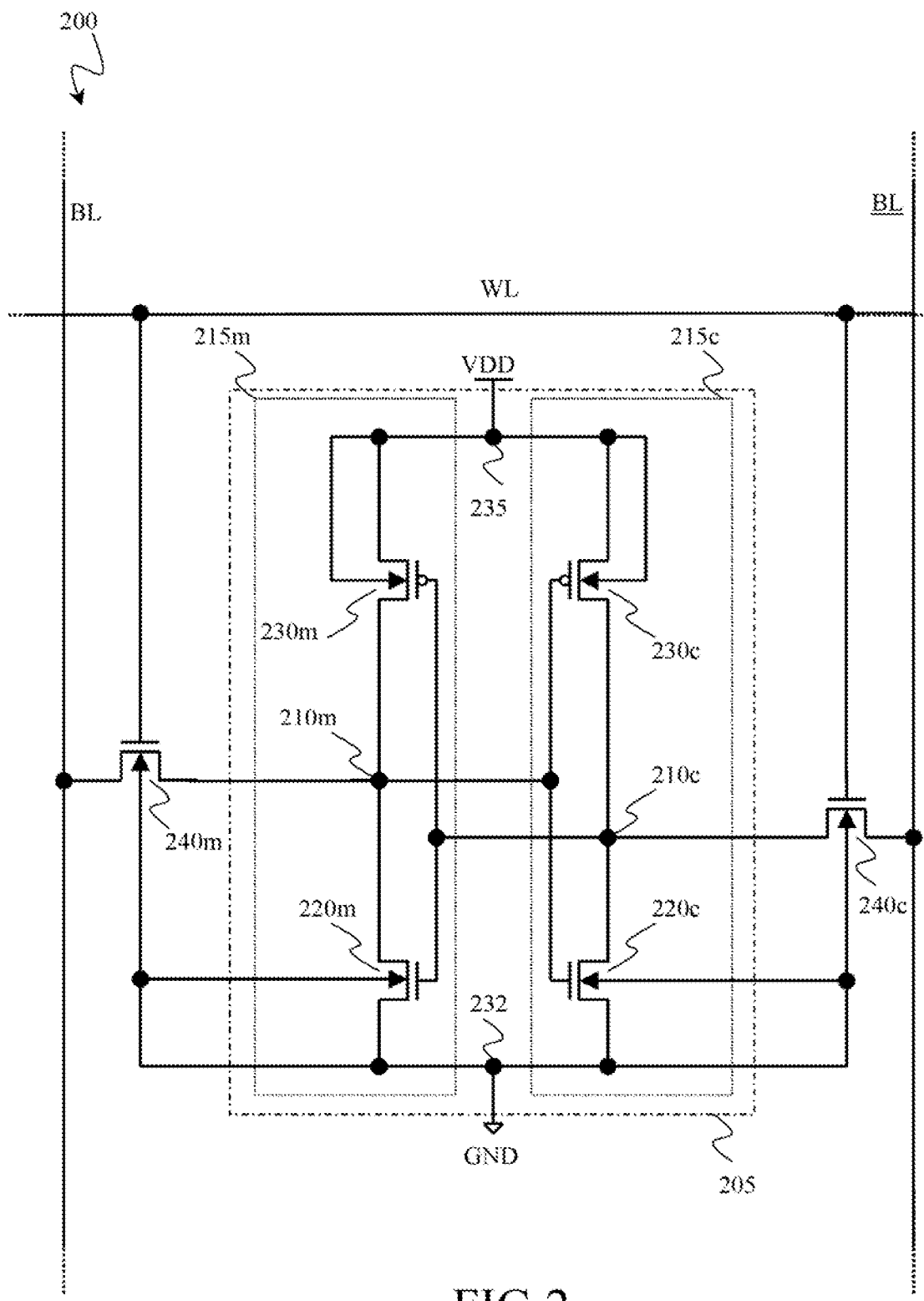
FIG. 2 shows a principle circuit diagram of a conventional memory cell.

Turning now to FIG. 2, there is shown a principle circuit diagram of a conventional memory cell 200 included in the memory device described above; in particular, the memory cell 200 is of the 6T type (as formed by six transistors). From a functional point of view, the memory cell 200 includes a bistable latch 205, which comprises a main terminal 210$m$ and a complementary (or secondary) terminal 210$c$. The bistable latch 205 is formed by two NOT gates (logic inverters) indicated as main NOT gate 215$m$ and complementary NOT gate 215$c$. Each NOT gate 215$m$, 215$c$ includes an N-channel MOS storage transistor 220$m$, 220$c$ (pull-down transistor) and a P-channel MOS storage transistor 230$m$, 230$c$ (pull-up transistor). The pull-down transistor 220$m$, 220$c$ has a source terminal coupled to a reference terminal 232 which provides a reference (i.e., ground) voltage GND of the memory device 100, and the pull-up transistor 230$m$, 230$c$ has a source terminal coupled to a power supply terminal 235 that provides a supply voltage VDD of the memory device 100 (e.g., 1-2V). The pull-down transistor 220$m$, 220$c$ and the pull-up transistor 230$m$, 230$c$ have a common gate terminal defining an input terminal of the NOT gate 215$m$, 215$c$, which is coupled to the other terminal 210$c$, 210$m$ of the bistable latch 205; in addition, the pull-down transistor 220$m$, 220$c$ and the pull-up transistor 230$m$, 230$c$ have a common drain terminal defining an output terminal of the NOT gate 215$m$, 215$c$, which is coupled to the corresponding terminal 210$m$, 210$c$ of the bistable latch 205. With this arrangement, the logic NOT gates 215$m$ and 215$c$ are then coupled in positive-feedback loop. The memory cell 200 also includes an N-channel MOS main access transistor 240$m$ and an N-channel MOS complementary access transistor 240$c$ (pass-gate transistors). Each pass-gate transistor 240$m$, 240$c$ has a conduction terminal (source/drain) coupled to the corresponding terminal 210$m$, 210$c$ of the bistable latch 205. All the (N-channel) transistors 220$m$, 220$c$, 240$m$, 240$c$ have a bulk terminal coupled to the reference terminal 232; on the contrary, all the (P-channel) pull-up transistors 230$m$, 230$c$ have a bulk terminal coupled to the power supply terminal 235.

A main bit line BL is coupled to another conduction terminal of the main pass-gate transistor 240$m$, and a complementary bit line BL is coupled to another conduction terminal of the complementary pass-gate transistor 240$c$. These bit lines BL, BL couple all the memory cells of the same column of the matrix to the column decoder (not shown in the figure). A word line WL is coupled to a gate terminal of both the pass-gate transistors 240$c$ and 240$m$. The word line WL couples all the memory cells of the same row of the matrix to the row decoder (not shown in the figure).

The bistable latch 205 has two stable equilibrium conditions. In particular, when the main terminal 210$m$ is at a voltage corresponding to a first logic value, such as a logic value 0 (typically, corresponding to the ground voltage GND) and the complementary terminal 210$c$ is at a voltage corresponding to a second logic value, such as a logic value 1 (typically corresponding to the supply voltage VDD), the bistable latch 205 stores the logic value 0; conversely, when the main terminal 210$m$ is at the voltage corresponding to the logic value 1 and the complementary terminal 210$c$ is at the voltage corresponding to the logic value 0, the bistable latch 205 stores the logic value 1.

During a write operation of a selected bit in the memory cell 200, the main bit line BL and the complementary bit line BL are pre-loaded to the voltage of the bit to be written and to its logic complement, respectively; the word line WL is then enabled (e.g., to the supply voltage VDD), so that the pass-gate transistors 240$m$ and 240$c$ are turned on, thereby coupling the main terminal 210$m$ with the main bit line BL and the complementary terminal 210c with the complementary bit line BL; in this way, the memory cell 200 moves to the equilibrium condition corresponding to the bit to be written; by disabling the word line WL (for example, to the reference voltage such as the ground voltage GND), the pass-gate transistors 240m and 240c are switched off, so that the written bit is stored into the memory cell 200 until a new write operation thereon (or until the shutting down of the memory device).

During a (differential-type) read operation of the memory cell 200, both the main bit line BL and the complementary bit line BL are pre-loaded to a predetermined pre-load voltage (e.g., the supply voltage VDD). The word line WL is then enabled so that the pass-gate transistors 240c and 240m are switched on thereby coupling the main terminal 210m with the main bit line BL and the complementary terminal 210c with the complementary bit line BL, respectively. In this way, depending on whether the memory cell 200 stores the logic value 0 or the logic value 1, the main bit line BL or the complementary bit line BL, respectively, will start to discharge and the read/write circuit (not shown in the figure) will detect a potential difference between the two bit lines BL and BL. The polarity of this potential difference, positive or negative according to whether the main bit line BL or the complementary bit line BL discharges, allows determining the logic value (0 or 1, respectively) of the bit stored in the memory cell 200.

Figure 3:
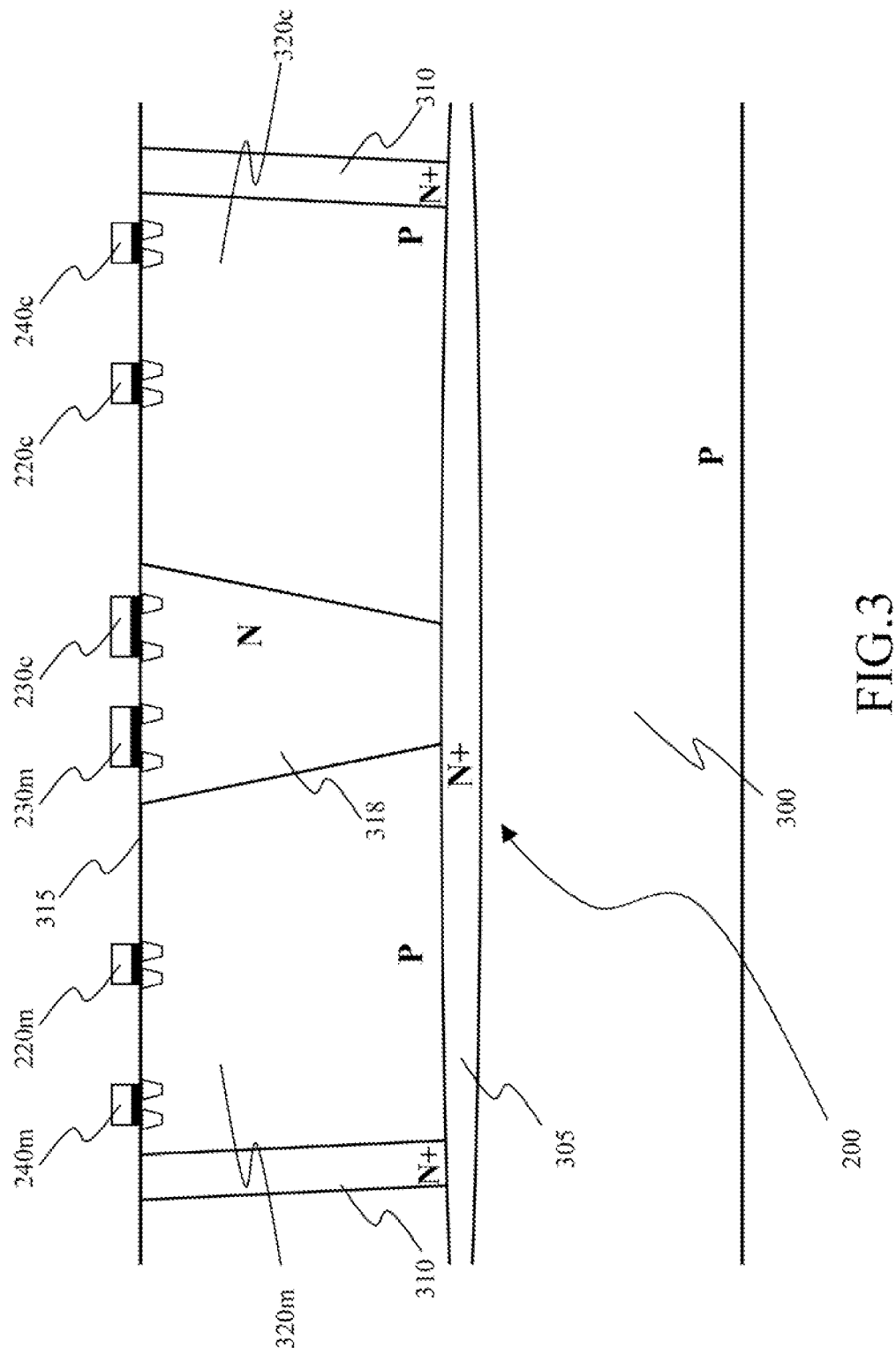
FIG. 3 schematically shows a cross-sectional detail of a chip of semiconductor material that comprises a matrix of memory cells in a conventional structure.

In FIG. 3 there is schematically shown a cross-sectional detail of a chip of semiconductor material 300 (e.g., silicon) in which the matrix of memory cells according to a conventional structure is formed. For example, the chip 300 is of P-type (as usual, the concentrations of impurities (or dopant) of N-type and P-type are denoted by adding the sign + or the sign − to the letters N and P to indicate a relatively high or relatively low concentration of impurities, respectively; the letters N and P without the addition of any sign + or − denote intermediate concentration values). For the sake of simplicity, in the figure there is shown a portion of the chip 300 which comprises a single memory cell 200. In detail, by the use of a technique called Deep N-Well or DNW, a buried region 305 of N+ type is implanted deeply into the chip 300. At this point, there is formed (for example, by ion implantation, or by a deposition preceded by an etching phase) a contact region 310 of N+ type, which extends from a front surface 315 of the chip 300 to contact the buried region 305 so as to delimitate a portion of the chip 300 for the memory cell 200. Within the contact region 310 there is formed an N-type well 318, which extends from the front surface 315 to contact the buried region 305; the N-type well 318 divides the portion of the chip delimited by the buried region 305 and the contact region 310 into a P-type main well 320m and a P-type complementary well 320c (electrically isolated from the rest of the chip 300 when the corresponding PN junctions are reverse biased). Inside the main P-type well 320m, the main pull-down transistor 220m and the main pass-gate transistor 240m of the memory cell 200 are formed, while inside the P-type complementary well 320c the complementary pull-down transistor 220c and the complementary pass-gate transistor 240c of the memory cell 200 are formed (each one including an N+ type drain region, an N+ type source region, and an overbridging gate region). Inside the N-type well 318, the main pull-up transistor 230m and the complementary pull-up transistor 230c of the memory cell 200 are formed (each one including a P+ drain region, a P+ source region, and an overbridging gate region).

Figure 4:
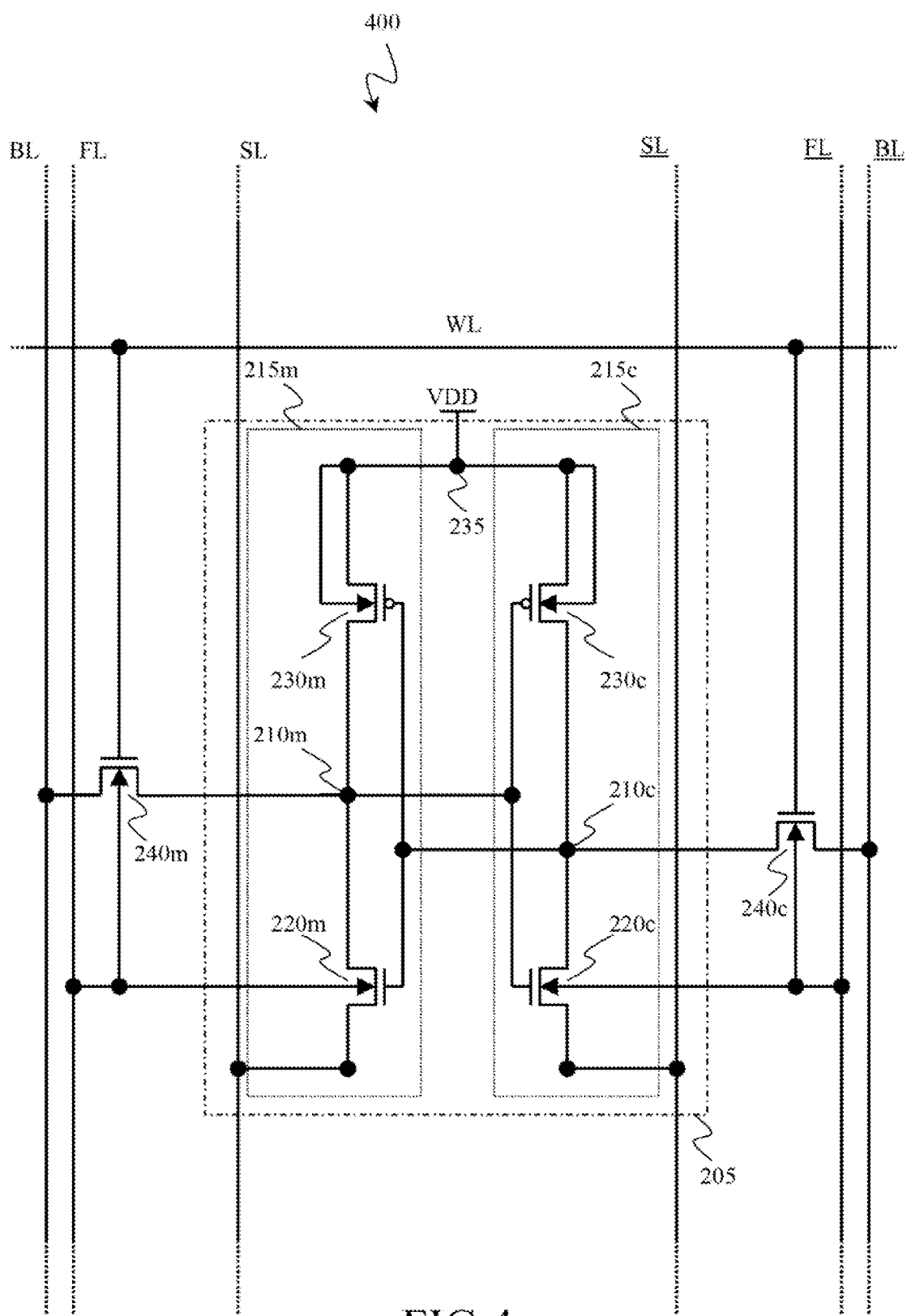
FIG. 4 shows a principle circuit diagram of a memory cell according to an embodiment.

In FIG. 4 a principle circuit diagram of a memory cell 400 according to an embodiment is shown. In general, the strategy followed in an embodiment includes starting from transistors being sized to make the memory cell more stable in reading and in the standby condition (to ensure that no unwanted switching take place), and recovering the writing reliability with techniques described below.

In detail, the memory cell 400 differs from the memory cell described above as follows. The memory cell 400 includes a main well line FL coupled to the bulk terminal of the main pull-down transistor 220m and to the bulk terminal of the main pass-gate transistor 240m (i.e., the common P-type well in which they are formed), and a complementary well line FL coupled to the bulk terminal of the complementary pull-down transistor 220c and to the bulk terminal of the complementary pass-gate transistor 240c (i.e., the common P-type complementary well in which they are formed). The well lines FL and FL couple all of the memory cells in the same column of the matrix to the biasing unit (not shown in the figure). The memory cell 400 also comprises a main source line SL coupled to the source terminal of the main pull-down transistor 220m, and a complementary source line SL coupled to the source terminal of the complementary pull-down transistor 220c. Also the source lines SL and SL couple all of the memory cells in the same column of the matrix to the biasing unit.

The operation of the memory cell 400 may be summarized as follows. During a write operation of a selected bit into the memory cell 400, the well line FL, FL associated with the bit line BL, BL at the logic value 0 provides a writing bias voltage VFB greater than zero (e.g., 0.2-0.4V); the other well line FL, FL (associated with the bit line BL, BL at the logic value 1) instead provides the ground voltage GND. The writing bias voltage VFB acts on the corresponding transistors 220m, 240m or 220c, 240c through an effect known as body effect. Such body effect causes a reduction of a threshold voltage VTN of the transistors 220m, 240m or 220c, 240c with a quadratic proportionality with respect to the value of the writing bias voltage VFB. Thus, there is a writing threshold voltage $VTN_F$ of the transistors 220m, 240m or 220c, 240c to which the writing bias voltage VFB is applied, which is lower than a normal threshold voltage $VTN_0$ of the transistors 220m, 240m or 220c, 240c to which the ground voltage GND, or approximately the ground voltage GND, is applied (for example, from 0.05 to 0.15 V instead of 0.2 V).

As a further improvement, at the same time the source line SL, SL associated with the bit line BL, BL at the logic value 1 provides a bias voltage VS greater than zero (e.g., from 0.2 to 0.4 V), while the other source line SL, SL (associated with the bit line BL, BL at the logic value 0) provides the ground voltage GND. The bias voltage VS lowers a corresponding control voltage VGS of the pull-down transistor 220m, 220c (applied between the source terminal and the gate terminal). Furthermore, the bias voltage VS is transferred to the corresponding terminal 210m, 210c of the bistable latch 205 through the pull-down transistor 220m, 220c. In this way, the bias voltage VS also lowers a control voltage VGS of the opposite pull-up transistor 230m, 230c (applied between the source terminal and the gate terminal).

Considering, as an example, the case wherein the memory cell 400 stores the logic value 1 (i.e., with the main terminal 210m at the supply voltage VDD and the complementary terminal 210c at the ground voltage GND). In this condition, the main pull-down transistor 220m is turned off, while the main pull-up transistor 230m is turned on; on the contrary, the complementary pull-down transistor 220c is turned on, while the complementary pull-up transistor 230c is turned off.

If the logic value 0 is to be written, the main bit line BL is brought to the ground voltage GND and the complementary bit line BL is brought to the supply voltage VDD (while the word line WL is brought to the supply voltage VDD). At the same time, the main well line FL is brought to the writing bias voltage VFB, while the complementary well line FL is brought to the ground voltage GND; furthermore, the main source line SL is brought to the ground voltage GND, while the complementary source line SL is brought to the bias voltage VS. In this way, the pass-gate transistors 240m, 240c turn on, thereby causing the turning on of the main pull-down transistor 220m and the turning off of the main pull-up transistor 230m, and at the same time the turning off of the complementary pull-down transistor 220c and the turning on of the complementary pull-up transistor 230c.

In an embodiment, the bulk terminals of the main transistors 240m and 220m receive the writing bias voltage VFB, so their threshold voltage VTN is equal to the writing threshold voltage $VTN_F$ (lower than the normal threshold voltage $VTN_0$). The main pass-gate transistor 240m then turns on more easily, even when the supply voltage VDD applied to its gate terminal is of a low value; in addition, the main pass-gate transistor 240m is more conductive, thereby facilitating the discharge of the main terminal 210m to the ground voltage GND. At the same time, the main pull-down transistor 220m turns on more easily, even when the supply voltage VDD applied to its gate terminal by the complementary bit line BL is of a relatively low value.

An embodiment such as described above allows a reliable writing without compromising the reading and standby condition stability. For example, it may be possible to form the transistors of the memory cell 400 with such dimensions to ensure a stable reading and standby condition (i.e., long-channel pass-gate transistors 240m, 240c, wide pull-down transistors 220m, 220c, and minimum sized pull-up transistors 230m, 230c) and, thanks to the selective application of the writing bias voltage VFB, in any case having a reliable writing.

An embodiment of the memory cell 400 may be particularly advantageous when used in highly scaled technologies and/or at low supply voltages. In that case, it may be possible to size the transistors in such a way to make the memory cell 400 highly stable in reading and in the standby condition (to avoid unwanted switching), nevertheless obtaining a reliable writing due to its selective biasing.

In parallel, the source terminal of the complementary pull-down transistor 220c receives the bias voltage VS, so its control voltage VGS is reduced. The complementary pull-down transistor 220c is then turned off more easily. At the same time, also the control voltage VGS of the main pull-up transistor 230m is reduced by about the same value. It follows that the main pull-up transistor 230m is turned off more easily, even when the supply voltage VDD applied to its source terminal is of a relatively low value.

All of the above may make the write operation of the memory cell 400 even more reliable (particularly, in very scaled technologies and/or at low supply voltages).

Dual considerations apply if the memory cell 400 stores the logic value 0, and the logic value 1 is to be written.

At the end of the write operation, the memory cell 400 enters the standby condition. In this case, both the well lines FL, FL, and both the source lines SL, SL provide the ground voltage GND (so as to conventionally bias the memory cell 400). In this way the bistable 205 properly maintains the stored logic value.

During a read operation of the memory cell 400, both the well lines FL, FL are biased at a reading bias voltage VRB intermediate between the writing bias voltage VFB and the ground voltage GND (e.g., 0.1V-0.2V). Therefore, the threshold voltage VTN of the transistors 240m, 240c, 220c and 220m is equal to a reading threshold voltage $VTN_R$, lower than the normal threshold voltage $VTN_0$, but greater than the writing threshold voltage $VTN_F$ (e.g., 0.8-1.2 V). Both the source lines SL and SL instead provide the ground voltage GND. Such reading threshold voltage $VTN_R$ makes the turning on of the pass-gate transistors 240m, 240c slightly easier (even when the supply voltage VDD applied to their gate terminals is of low value); moreover, the pass-gate transistors 240m, 240c are slightly more conductive, thereby facilitating the discharging of one of the bit lines BL, BL (according to the logic value stored in the memory cell 400). At the same time, however, there is reduced or no risk of unwanted switching of the pull-down transistor 220m, 220c. In this way, it may be possible to make more reliable also the read operation of the memory cell 400.

Figure 5:
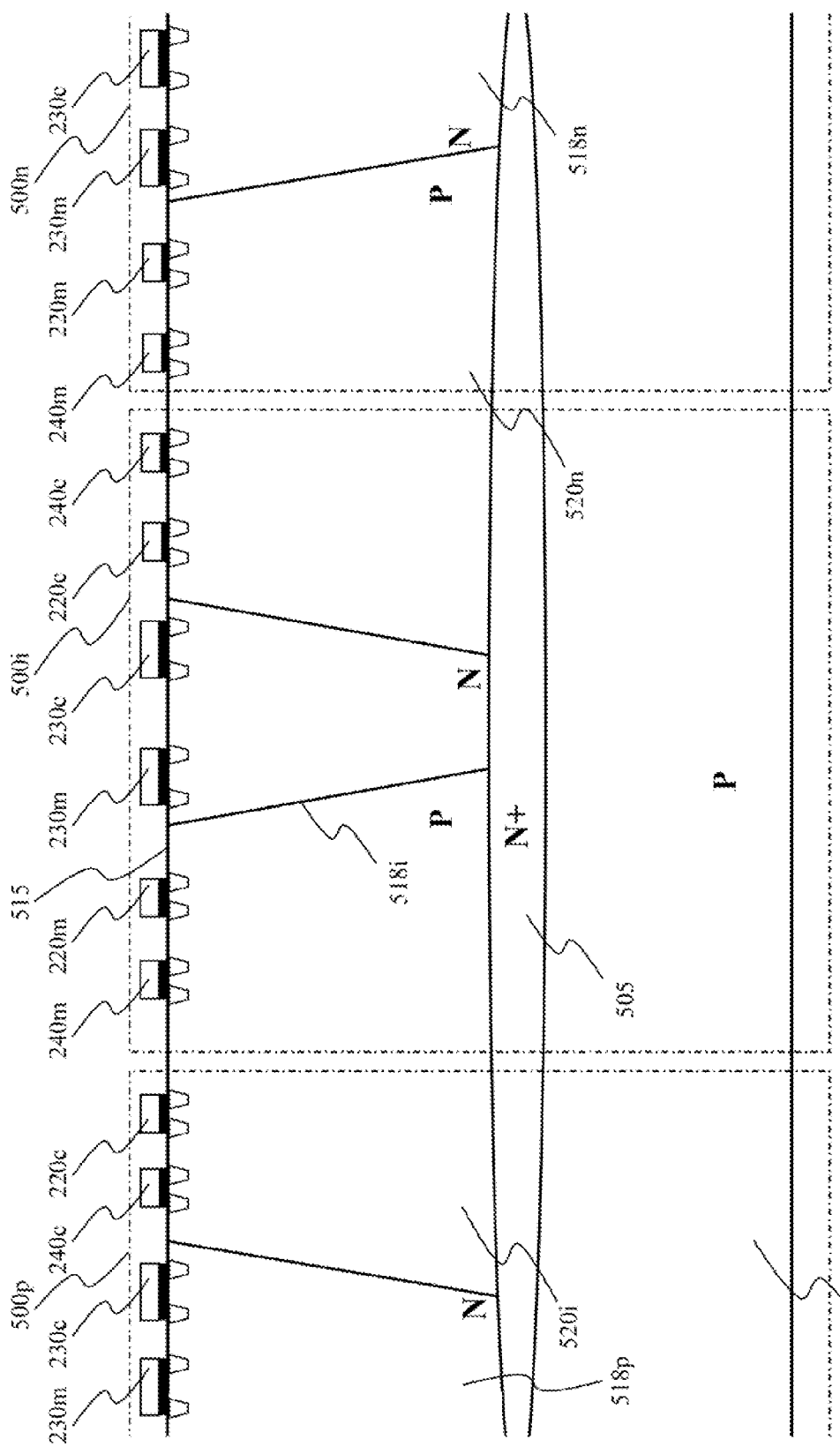
FIG. 5 schematically shows a cross-sectional detail of a chip of semiconductor material that comprises a matrix of memory cells in another conventional structure.

In FIG. 5 there is shown a cross-sectional detail of a chip of semiconductor material 300 wherein the matrix of memory cells is formed according to another conventional structure. More specifically, in the figure an intermediate memory cell 500i, a portion of a previous memory cell 500p and a portion of a next memory cell 500n along a same row of the matrix are visible.

Through the same techniques hereinabove described, an N+ type buried region 505 is implanted, and an N-type well, which extends from a front surface 515 of the chip 300 to contact the buried region 505, is formed for each memory cell; such N-type wells delimitate a P-type well for each memory cell (substantially electrically isolated from the chip 300). In particular, in the example shown in the figure, three N-type wells 518p, 518i, and 518n (for the memory cells 500p, 500i and 500n, respectively) are shown, which define two P-type wells 520i and 520n, respectively. Each P-type well 520i, 520n is shared with the previous memory cell 500p, 500i along the row, in such a way to act both as main P-type well for the corresponding memory cell 500i, 500n and as complementary P-type well for the previous memory cell 500p, 500i. In particular, within the P-type well 520i (main P-type well for the memory cell 500i and complementary P-type well for the memory cell 500p) the main pull-down transistor 220m and the main pass-gate transistor 240m of the memory cell 500i, and the complementary pull-down transistor 220c and the complementary pass-gate transistor 240c of the memory cell 500p are formed (each formed by a drain region of N+ type, a source region of N+ type and an over-bridging gate region). Similarly, within the P-type well 520n (complementary P-type well of the memory cell 500i and main P-type well of the memory cell 500n) the complementary pull-down transistor 220c and the complementary pass-gate transistor 240c of the memory cell 500i, and the main pull-down transistor 220m and the main pass-gate transistor 240m of the memory cell 500n are formed (each formed by an N+ type drain region, an N+ type source region and an over-bridging gate region). As above, in the N-type wells 518p, 518i, 518n the pull-up transistors 230m and 230c of the corresponding memory cells 500p, 500i, 500n are formed (each one formed by a P+ type drain region, a P+ type source region and an overbridging gate). The structure described above is more compact, since it avoids wasting space in the chip 300 between the P-type wells of adjacent memory cells (along each row of the matrix).

Figure 6:
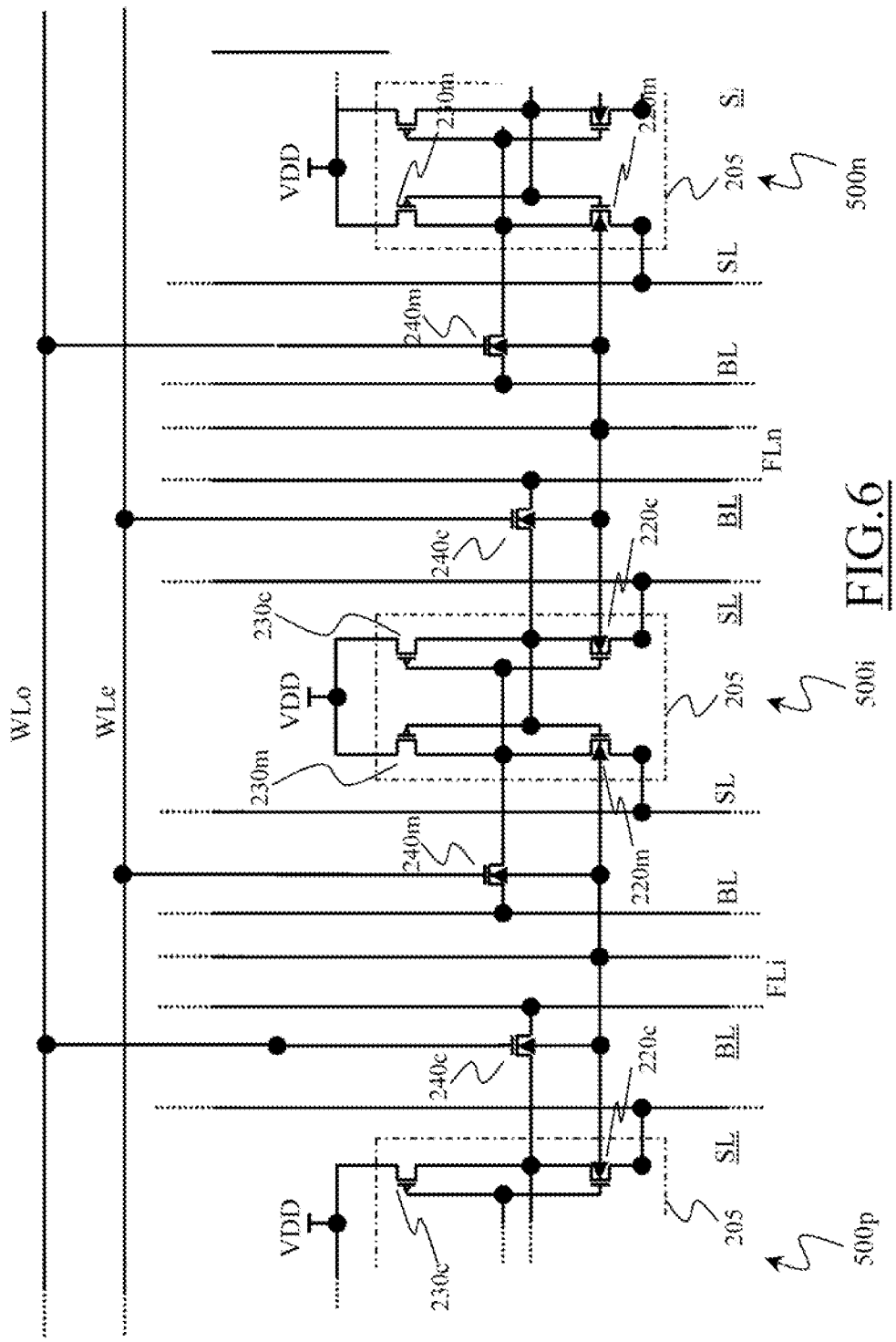
FIG. 6 shows a principle circuit diagram of a portion of a matrix of memory cells according to another embodiment.

FIG. 6 shows a portion of memory matrix according to another embodiment in which the memory cell 500i, and a portion of the memory cells 500p and 500n, are visible. In this case, a single well line (adapted to supply the voltages VFB, GND, or VRB) is provided for each column of the matrix; in particular, in the example illustrated in the figure, two well lines FLi and FLn for the memory cells 500i and 500n, respectively, are shown. Each well line FLi, FLn is shared with the previous memory cell 500p, 500i along each row of the matrix, in order to operate as both the main well line of the corresponding memory cell 500i, 500n and the complementary well line of the previous memory cell 500p, 500i. In particular, the well line FLi (main well line for the memory cell 500i and complementary well line for the memory cell 500p) is coupled to both the bulk terminals of the main transistors 240m, 220m of the memory cell 500i and of the complementary transistors 240c, 220c of the memory cell 500p. Similarly, the well line FLn (complementary well line for the memory cell 500i and main well line for the memory cell 500n) is coupled to both the bulk terminals of the complementary transistors 240c, 220c of the memory cell 500i and of the main transistors 240m, 220m of the memory cell 500n.

In an embodiment, a pair of word lines is provided for each row of the matrix. In particular, an odd word line WLo is coupled to the gate terminals of the pass-gate transistors 240m, 240c of the memory cells (e.g., the memory cells 500p and 500n) that occupy an odd position in the row, and an even word line WLe is coupled to the gate terminals of the pass-gate transistors 240m, 240c of the memory cells (e.g., the memory cell 500i) that occupy an even position in the row.

During a write operation of a selected bit, for example, in the memory cell 500i, the corresponding word line WLe is enabled (to the supply voltage VDD) while the other word line WLo is disabled (to the ground voltage GND). The (main) well line FLi of the memory cell 500i to be written (if the selected bit has the logic value 0) or the (complementary) well line FLn of the next memory cell 500n (if the selected bit has the logic value 1) provides the writing bias voltage VFB, while all the other well lines provide the ground voltage GND.

As hereinabove, in the case wherein the selected bit to be written in the memory cell 500i has the logic value 0 (with its main bit line BL at the ground voltage GND and its complementary bit line BL at the supply voltage VDD), the bulk terminal of the main transistors 240m and 220m of the memory cell 500i receives the writing bias voltage VFB (from the well line FLi), so their threshold voltage VTN is equal to the writing threshold voltage $VTN_F$ (so as to make the write operation more reliable).

However, the well line FLi applies the same writing bias voltage VFB also to the bulk terminal of the complementary transistors 240c and 220c of the memory cell 500p, so that also their threshold voltage VTN is equal to the writing threshold voltage $VTN_F$. However, in this case, the odd word line WLo provides the ground voltage GND to the gate terminal of the pass-gate transistors 240m, 240c of the memory cell 500p (in addition to the gate terminals of the pass-gate transistors 240m, 240c of the memory cell 500n). Therefore, such pass-gate transistors 240m, 240c of the memory cell 500p, 500n will remain turned off. In particular, this configuration prevents the complementary pass-gate transistor 240c of the memory cell 500p from turning on because of its writing threshold voltage $VTN_F$; this could in turn cause a turning on of the complementary pull-down transistor 220c of the memory cell 500p due to its writing threshold voltage $VTN_F$, thereby causing a spurious writing of the logic value 1 in the memory cell 500p.

Dual considerations apply if the selected bit to be written in the memory cell 500i has the logic value 1 (in which case the unwanted switching of the memory cell 500n is prevented).

During a read operation of the same memory cell 500i, the corresponding word line WLe is enabled (to the supply voltage VDD) and the other word line WLo is disabled (to the ground voltage GND). The (main) well line FLi of the memory cell 500i to be read and the (complementary) well line FLn of the next memory cell 500n provide the reading bias voltage VRB, while all the other well lines provide the ground voltage GND.

As above, the bulk terminal of the transistors 240m, 240c, 220m and 220c of the memory cell 500i receives the reading bias voltage VRB from the well lines FLi, FLn, so their threshold voltage VTN is equal to the reading threshold voltage $VTN_R$ (to make the read operation more reliable).

The well lines FLi and FLn apply the same reading bias voltage VRB also to the bulk terminal of the complementary transistors 240c and 220c of the memory cell 500p and to the bulk terminals of the main transistors 240m and 220m of the memory cell 500n, so also their threshold voltage VTN is equal to the reading threshold voltage $VTN_R$. Again, the odd word line WLo provides the ground voltage GND to the gate terminal of the pass-gate transistors 240m, 240c of the memory cell 500p and to the gate terminal of the pass-gate transistors 240m, 240c of the memory cell 500n. Therefore, such pass-gate transistors 240m, 240c of the memory cells 500p, 500n will remain turned off. In particular, this configuration prevents affecting adjacent memory cells during the read operation.

In this way, it may be possible to obtain the same benefits as above (i.e., reliable writing and stable reading and standby condition) despite the potential interference between each pair of adjacent memory cells in each row (caused by their shared well lines).

Naturally, in order to satisfy local and specific requirements, a person skilled in the art may apply to the one or more embodiments described above many logical and/or physical modifications and alterations. More specifically, although one or more embodiments have been described with a certain degree of particularity, it should be understood that various omissions, substitutions, and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment may be incorporated in any other embodiment as a matter of general design choice.

For example, similar considerations apply if the memory device has a different architecture or includes equivalent components (either separated or combined, in whole or in part), such as, for example, a memory cell of resistive load type; in addition, the memory device may have different operating characteristics. The logic values 0 and 1 may be represented by different reference voltages (also reversed with respect to each other). In any case, nothing prevents changing the threshold voltages of one or more transistors of the memory cell selectively according to the logic value to be written in another way.

Each memory cell may be formed by different types of transistors, such as JFET transistors; similarly, in a memory cell the transistors may have opposite doping, that is P-channel MOS pass-gate and pull-down transistors and N-channel MOS pull-up transistors. Similarly, the chip on which the memory device is integrated may have an N-type doping (with isolated N-type wells formed in P-type wells).

In addition, the isolated wells may be common to more than two memory cells; for example, a single isolated well may be common to all the memory cells of two adjacent columns. More than two word lines may also be provided to access sub-groups of memory cells arranged in a same row of the array of the memory device separately. Conversely, a single word line per row may be provided even if the isolated wells are shared between two or more memory cells.

The voltages used to bias the main well and the complementary well of the memory cell during its write operation may also be both different from the voltage applied to them in its standby condition.

Nothing prevents applying the selective biasing of the source terminals to a memory cell with a different structure. Moreover, the selective biasing of the source terminals may be used independently of the selective biasing of the bulk terminals, and vice-versa.

Alternatively or in addition, the bias voltage may be applied to the source terminals of the pull-up transistors (through a biasing line coupled thereto).

In this case as well, the voltages used to bias the source terminal of the main pull-down transistor and of the complementary pull-down transistor of the memory cell during its write operation may also be both different from the voltage applied thereto in its standby condition.

Nothing prevents biasing the transistors in order to force different threshold voltages during the read operation.

In particular, the main well and the complementary well may be biased to a different voltage during the read operation, even simply equal to the ground voltage GND.

The above values of the biasing voltages (for the wells and/or the source terminals, both during the writing operation and during the reading operation) are indicative only, and should not be understood as limitative.

An embodiment lends itself to be implemented by an equivalent method (using similar steps, removing some steps being not essential, or adding further optional steps); moreover, the steps may be performed in different order, in parallel or overlapped (at least in part).

It should be readily apparent that an embodiment might be part of the design of an integrated device. The design may also be created in a programming language; in addition, if the designer does not manufacture the integrated device or its masks, the design may be transmitted through physical means to others. Anyway, the resulting integrated device may be distributed by its manufacturer in the form of a raw wafer, as a naked chip, or in packages.

Moreover, the memory device may be integrated with other circuits in the same chip, or it may be mounted in intermediate products (such as motherboards) and coupled with one or more other chips (such as a processor). In any case, the memory device may be adapted to be used in complex systems (such as a mobile phone).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A memory array including a plurality of memory cells configured to store data, wherein at least one memory cell of said memory array comprises:
    a first transistor;
    a second transistor;
    wherein the first and second transistors are coupled in series to form an inverter circuit of a latch;
    a first bias node configured to generate a variable first bias voltage coupled to a body of the second transistor;
    a second bias node configured to generate a variable second bias voltage coupled to a source terminal of the second transistor; and
    an access transistor coupled between an access node and an intermediate node between the first and second transistors,
    wherein during writing of data into the latch of the memory cell, said variable second bias voltage having a first voltage value selected dependent on a logic state of the data to be written into the memory cell that is present on the access node; and
    wherein during reading of data into the latch of the memory cell, said variable second bias voltage having a second voltage value different from the first voltage value.

2. The memory array of claim 1 wherein:
    the first transistor comprises a p-channel transistor; and
    the second transistor comprises an n-channel transistor.

3. The memory array of claim 1 wherein the first transistor comprises a body coupled to a voltage supply node; and further comprising:
    a third transistor coupled to a node between the first and the second transistor and comprising a body coupled to the first bias node.

4. The memory array of claim 3 wherein the second and third transistors comprise N type transistors.

5. The memory array of claim 4 wherein the first transistor comprises a P type transistor.

6. The memory array of claim 1, further comprising:
    a first well;
    a second well;
    wherein the first transistor is disposed in the first well;
    wherein the second transistor is disposed in the second well; and
    wherein the first bias node is coupled to the second well.

7. The memory array of claim 1 wherein the first and second wells have a different conductivity type.

8. The memory array of claim 1, wherein said at least one memory cell further comprises:
    a reference node;
    a first intermediate node;
    a second intermediate node;
    wherein the first transistor is coupled between the first intermediate node and the reference node and has a control node coupled the second intermediate node;
    wherein the second transistor is coupled between the first intermediate node and the second bias node and has a control node coupled to the second intermediate node;
    a third transistor coupled between the reference node and the second intermediate node and having a control node coupled to the first intermediate node; and
    a fourth transistor coupled between the second intermediate node and a source node and having a control node coupled to the first intermediate node.

9. The memory array of claim 1, wherein said access transistor has a bulk node coupled to the first bias node.

10. The memory array of claim 1 wherein the first voltage value is zero volts if the logic state is logic "0" and the second voltage value is a positive non-zero voltage if the logic state is logic "1".

11. The memory array of claim 10, wherein the positive non-zero voltage is in a voltage range of 0.2 to 0.4 volts.

12. A memory array including a plurality of memory cells configured to store data, wherein at least one memory cell of said memory array comprises:
    a first inverter circuit having a first intermediate node and a first transistor source node;

a second inverter circuit having a second intermediate node and a second transistor source node;

wherein the first and second inverter circuits are coupled to form a bistable latch;

a first bias node configured to generate a variable first bias voltage coupled to the first transistor source node of the first inverter circuit; and a second bias node configured to generate a variable second bias voltage coupled to the second transistor source node of the second inverter circuit;

a first access transistor coupled between a first access node and the first intermediate node of the first inverter circuit; and a second access transistor coupled between a second access node and the second intermediate node of the second inverter circuit;

wherein the first variable bias voltage and second variable bias voltage have different voltage values during an operation to write data into the bistable latch of the memory cell, the voltage value of the first variable bias voltage selected dependent on a logic state of the data to be written into the memory cell that is present on the first access node, and the voltage value of the second variable bias voltage is selected dependent on a logic state of the data to be written into the memory cell that is present on the second access node.

13. The memory array of claim 12, wherein the first inverter circuit includes a first transistor having the first transistor source node and the second inverter circuit includes a second transistor having the second transistor source node; further comprising:

a third bias node configured to generate a variable third bias voltage coupled to a body of the first transistor of the first inverter circuit; and a fourth bias node configured to generate a variable fourth bias voltage coupled to a body of the second transistor of the second inverter circuit.

14. The memory array of claim 12, further comprising:

a third bias node configured to generate a variable third bias voltage coupled to a body of the first access transistor; and a fourth bias node configured to generate a variable fourth bias voltage coupled to the second access transistor.

15. The memory array of claim 14, wherein the first inverter circuit includes a first transistor having the first transistor source node and a body coupled to the third bias node; and wherein the second inverter circuit includes a second transistor having the second transistor source node and a body coupled to the fourth bias node.

16. The memory array of claim 12, wherein the voltage value of each of the first and second variable bias voltages is zero volts if the logic state of the data is logic "0" and the voltage value is a positive non-zero voltage if the logic state of the data is logic "1".

17. The memory array of claim 16, wherein the positive non-zero voltage is in a voltage range of 0.2 to 0.4 volts.

* * * * *